United States Patent [19]
Lee et al.

[11] Patent Number: 5,792,684
[45] Date of Patent: Aug. 11, 1998

[54] PROCESS FOR FABRICATING MOS MEMORY DEVICES, WITH A SELF-ALIGNED CONTACT STRUCTURE, AND MOS LOGIC DEVICES WITH SALICIDE, BOTH ON A SINGLE SEMICONDUCTOR CHIP

[75] Inventors: Jin-Yuan Lee; Mong-Song Liang, both of Hsin-Chu, Taiwan

[73] Assignee: Taiwan Semiconductor Manufacturing Company Ltd., Hsin-Chu, Taiwan

[21] Appl. No.: 844,630

[22] Filed: Apr. 21, 1997

[51] Int. Cl.$^6$ ................... H01L 21/8242; H01L 21/336
[52] U.S. Cl. .................... 438/238; 438/666; 438/649
[58] Field of Search ................ 438/221, 229–233, 438/238, 287, 630, 49, 666

[56] References Cited

U.S. PATENT DOCUMENTS

| | | | |
|---|---|---|---|
| 5,066,602 | 11/1991 | Takemoto et al. | 437/31 |
| 5,340,762 | 8/1994 | Vora | 437/52 |
| 5,483,104 | 1/1996 | Godinho et al. | 257/758 |
| 5,547,893 | 8/1996 | Sung | 438/210 |
| 5,633,181 | 5/1997 | Hayashi | 438/253 |
| 5,668,035 | 9/1997 | Fang et al. | 438/239 |

*Primary Examiner*—Joni Chang
*Attorney, Agent, or Firm*—George O. Saile; Stephen B. Ackerman

[57] ABSTRACT

A semiconductor fabrication process has been developed in which both MOS memory devices and MOS logic devices are integrated on a single silicon chip. The process features combining process steps for both device types, however using a self-aligned contact structure, in the MOS memory device region, for purposes of increasing device density, while using metal silicide regions, only in MOS logic device regions, for purposes of improving device performance.

25 Claims, 5 Drawing Sheets

PROCESS FOR FABRICATING MOS MEMORY DEVICES, WITH A SELF-ALIGNED CONTACT STRUCTURE, AND MOS LOGIC DEVICES WITH SALICIDE, BOTH ON A SINGLE SEMICONDUCTOR CHIP

BACKGROUND OF THE INVENTION (1) Field of the Invention

This invention relates to fabrication methods used for semiconductor devices, and more specifically a process used to integrate logic and memory devices on a single semiconductor chip.

(2) Description of Prior Art

Advanced semiconductor chips, now being manufactured in industry, are composed of logic or memory devices. Logic devices are used to process information or data, while memory devices are used for data storage. These two types of devices can be found in almost all computers, however they are usually found on specific chips, reserved for either logic or memory applications. In systems in which logic and memory devices are packaged separately, data signals between the two may have to pass through several levels of packaging, which can result in undesirable propagation delays. In addition the manufacturing costs for fabricating wafers producing only logic chips, and wafers with only memory chips, are greater than if both logic and memory applications can be incorporated on the same chip. Therefore for performance and cost reasons the semiconductor industry has been motivated to produce a semiconductor chip with both the desired logic and memory requirements.

The efforts displayed by the semiconductor industry, in attempting to incorporate both logic and memory requirements on a single semiconductor chip have been increasing. Examples of this have been Takemoto, in U.S. Pat. No. 5,066,602, as well as by Vora, in U.S. Pat. No. 5,340,762. These inventions have addressed incorporating bipolar devices and complimentary metal oxide semiconductor, (CMOS), devices, on a single semiconductor chip. However a process for incorporating metal oxide semiconductor field effect transistor, (MOSFET), memory devices, using a self-aligned contact, (SAC), structure for improved density, and MOSFET logic devices, using a Self ALIgned siliCIDE, (Salicide), feature for improved performance, has not been evident. This invention will describe a novel fabrication process that allows memory devices, with a SAC structure, and logic devices, with salicide, to be built simultaneously.

SUMMARY OF THE INVENTION

It is an object of this invention to provide a process for fabricating MOS memory and MOS logic devices on the same semiconductor chip, or integrated circuit.

It is another object of this invention to fabricate the MOS memory devices featuring a SAC structure, that allows density enhancements to be realized.

It is yet another object of this invention to fabricate the MOS logic devices using a salicide feature, that allows performance enhancements to be realized.

In accordance with the present invention a fabrication process is described for integrating MOS memory devices and MOS logic devices on the same silicon chip. Thick field oxide regions, in the form of silicon oxide filled, shallow trenches, are first created for isolation purposes. A gate insulator layer is grown on the surface of the semiconductor substrate, followed by a deposition of an intrinsic layer of polysilicon. Photoresist masking is next performed to allow doping of the polysilicon layer to occur, via ion implantation procedures, in a region of the semiconductor substrate to be used for the MOS memory devices. A silicon oxide layer is next deposited on both the doped and intrinsic regions of the polysilicon layer, followed by photoresist masking, allowing the silicon oxide layer to be removed in regions of the semiconductor substrate to be used for MOS logic devices. Photolithographic and dry etching processing are next used to create a silicon oxide capped, doped polysilicon gate structure in the region of the semiconductor substrate to be used for MOS memory devices, while an intrinsic polysilicon gate structure is formed in a region of the semiconductor substrate to be used for MOS logic devices. Lightly doped source and drain regions are formed in regions of the semiconductor substrate used for both MOS memory and MOS logic devices, followed by the deposition of a silicon oxide layer. Anisotropic dry etching is used to create a silicon oxide spacer on the sides of the silicon oxide capped, doped polysilicon gate structure, as well as on the sides of the intrinsic polysilicon gate structure. Heavily doped source and drain regions are then formed in exposed regions of the semiconductor substrate used for both MOS memory and MOS logic devices. A silicon nitride layer is next deposited, followed by photoresist masking, and removal of the silicon nitride layer from the region of semiconductor substrate used for the MOS logic devices. A layer of titanium is then deposited and annealed to form a titanium silicide layer on the heavily doped source and drain regions, and the top surface of the intrinsic polysilicon gate structure, in regions of the semiconductor substrate to be used for MOS logic devices. Unreacted titanium is removed from the surface of the silicon oxide spacers overlying the intrinsic polysilicon gate structure, in the MOS logic device region, as well from the surface of the silicon nitride layer in the MOS memory regions. An interlevel insulator layer is deposited, followed by a photolithographic and dry etch procedure, used to open a self-aligned contact hole in the interlevel insulator layer, and the silicon nitride layer, exposing the heavily doped source and drain region, in the MOS memory device region. The self-aligned contact hole can be wider than the exposed region of the heavily doped source and drain region, overlapping the field oxide region and the silicon oxide capped, doped polysilicon gate structure. Another photolithographic and dry etching procedure is used to open a conventional contact hole in the interlevel insulator layer, exposing titanium silicide overlying source and drain regions, as well as titanium silicide overlying the intrinsic polysilicon gate structure, in the MOS logic device region. Interconnect metallization structures are next formed providing electrical connection to regions exposed in the self-aligned contact holes, as well as to regions exposed in the conventional contact holes.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
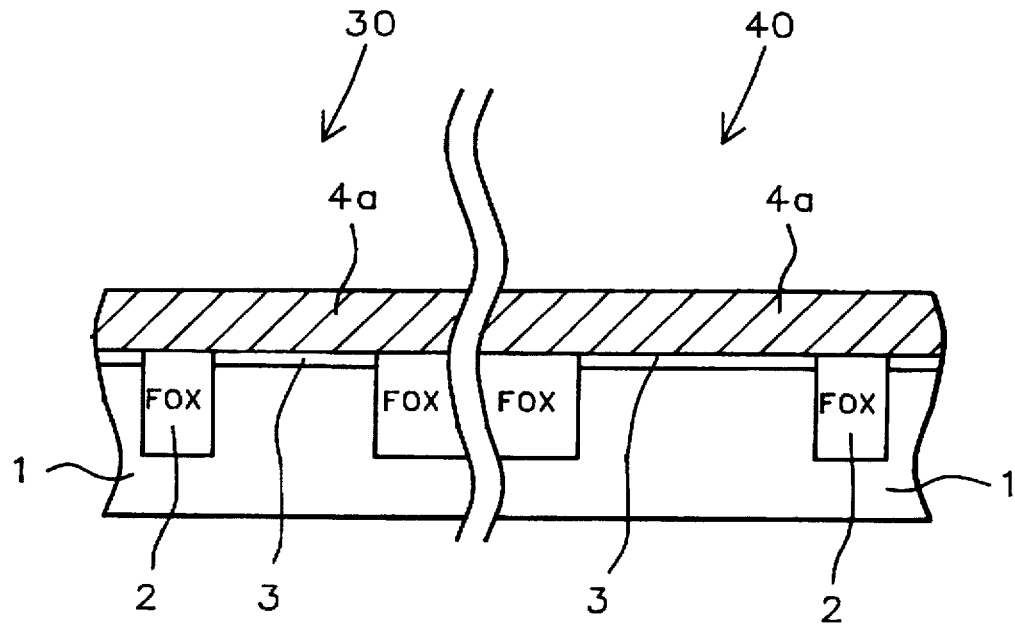
FIGS. 1–9 which schematically, in cross-sectional style, illustrates the stages of fabrication used to simultaneously create MOS memory devices, using a self-aligned contact structure, as well as MOS logic devices, featuring a salicide layer, on a semiconductor substrate.

The fabrication process used to simultaneously create both MOS memory devices and MOS logic devices on a single semiconductor chip will now be covered in detail. FIG. 1, shows an area, 30, to be used for fabrication of the MOS memory device, while a MOS logic device, will be fabricated in area, 40. Both memory and logic device will also be described as N type, MOSFET devices, however this invention can also be accomplished using P channel, or PFET devices, by creating N wells in specific areas of the semiconductor substrate, and using P type ion implantation dopants for P type source and drain regions.

A P type, single crystalline silicon substrate, 1, having a <100> crystallographic orientation is used. Thick field oxide, (FOX), regions, 2, are next formed in semiconductor substrate, 1, for purposes of isolation. FOX regions, 2, can be thermally grown regions, created via oxidation of exposed regions of semiconductor substrate, 1, while subsequent device regions are protected with a pattern of an oxidation resistant composite masking layer of silicon nitride, on an underlying silicon oxide pad layer. After oxidation at a temperature between about 850° to 1050° C., to a thickness between about 3000 to 5000 Angstroms. The oxidation masking silicon nitride layer is removed via use of a hot phosphoric acid solution, while the silicon oxide pad layer is removed via a buffered hydrofluoric acid solution. The preferred method of forming FOX regions, 2, is the use of silicon oxide filled, shallow trenches, created by initially forming shallow trenches in semiconductor substrate, 1, between about 2000 to 7000 Angstroms in depth, via conventional reactive ion etching, (RIE), procedures. After photoresist removal, accomplished via plasma oxygen ashing and careful wet cleans, a first layer of silicon oxide is deposited using either low pressure chemical vapor deposition, (LPCVD), or plasma enhanced chemical vapor deposition, (PECVD), procedures, at a temperature between about 400° to 800° C., to a thickness between about 5000 to 14000 Angstroms. Planarization procedures are next employed to removed silicon oxide from all regions but the shallow trench, resulting in the FOX regions, 2, comprised of silicon oxide filled, shallow trenches. Planarization can be accomplished via chemical mechanical polishing, or via selective RIE processing, using $CHF_3$ as an etchant.

A thin gate insulator layer, 3, of silicon dioxide, is next thermally grown in an oxygen—steam ambient, at a temperature between about 750° to 1000° C., to a thickness between about 40 to 150 Angstroms. Gate insulator layer, 3, is grown in both MOS device regions, 30, as well as in MOS logic device regions, 40, in areas not covered by FOX regions, 2. An intrinsic polysilicon layer, 4a, is next deposited via LPCVD procedures, at a temperature between about 300° to 700° C., to a thickness between about 1000 to 3000 Angstroms, using silane as a source. The result of the gate insulator oxidation and the polysilicon deposition procedure is schematically shown in FIG. 1.

Figure 2:
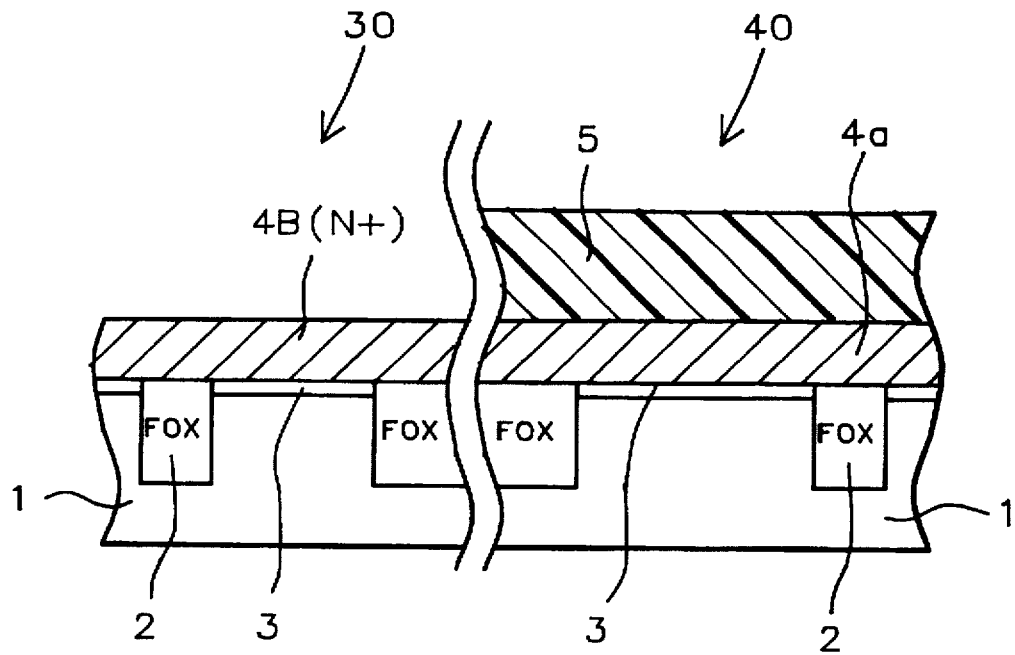

FIG. 2, schematically describes a process used to dope a region of polysilicon layer, 4a, to be used for MOS memory device purposes. A photoresist shape, 5, is used to block out MOS logic device region, 40, from an ion implantation of phosphorous, at an energy between about 10 to 40 KeV, at a dose between about 1E15 to 1E16 atoms/$cm^2$. The ion implantation procedure converts intrinsic polysilicon layer, 4a, in MOS memory region, 30, to a doped polysilicon layer, 4b, while polysilicon layer, 4a, remains undoped in MOS logic device region, 40. Photoresist shape, 5, is removed using plasma oxygen ashing and careful wet cleans.

Figure 3:
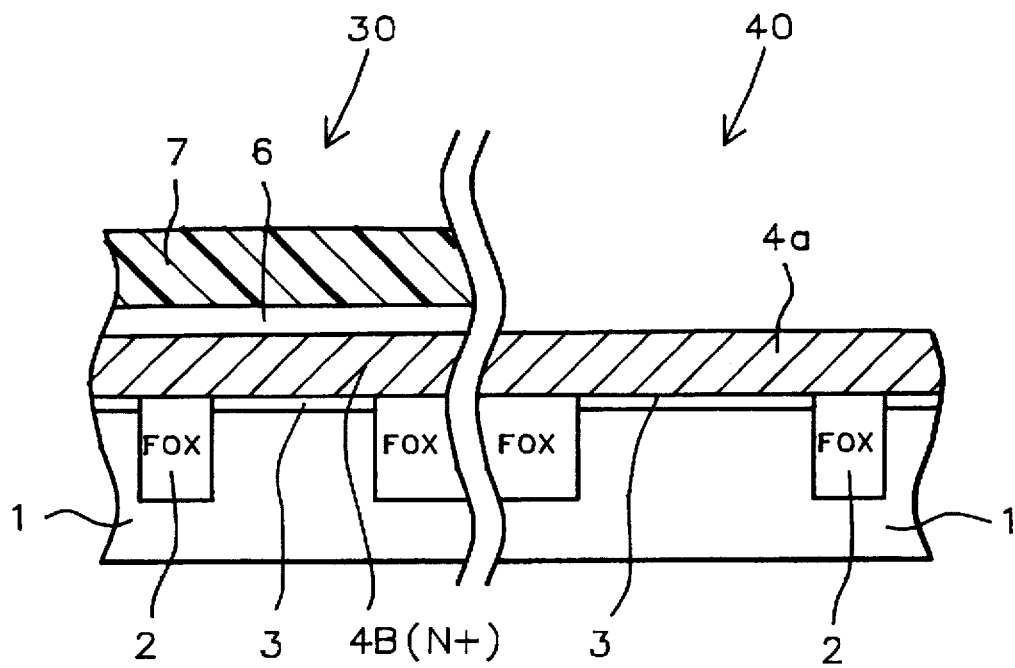
Figure 4:
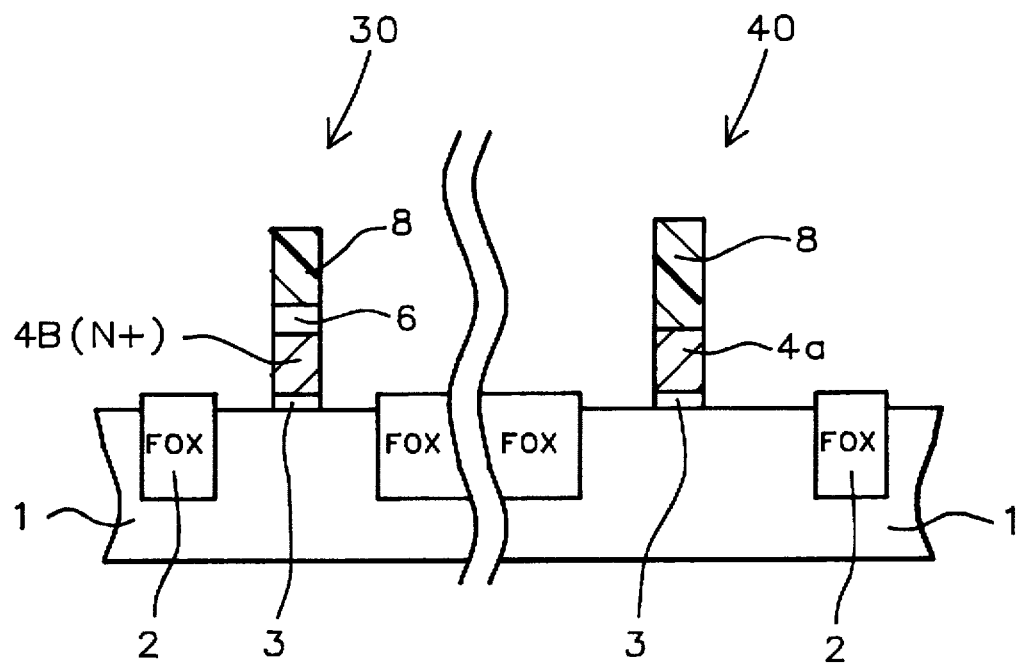

Another silicon oxide layer, 6, is next deposited using either LPCVD or PECVD procedures, at a temperature between about 400° to 800° C., to a thickness between about 1000 to 2500 Angstroms, using tetraethylorthosilicate, (TEOS), as a source. A photoresist shape, 7, is then used as a block out mask to allow removal of second silicon oxide layer, 6, from areas to be used for MOS logic device region, 40. Removal of second silicon oxide layer, 6, from MOS logic device region, 40, is accomplished via the use of a buffered hydrofluoric acid solution. This is shown schematically in FIG. 3. After removal of photoresist shape, 7, via plasma oxygen ashing and careful wet cleans, photoresist shapes, 8, are formed to provide the masking image used to create the polysilicon gate structures. A RIE procedure is then performed, initially using $CHF_3$ as an etchant for silicon oxide layer, 6, in the MOS memory device region, 30. During the $CHF_3$ cycle, intrinsic polysilicon layer, in MOS logic device region, 40, is exposed, but is not removed in the $CHF_3$ ambient. A second RIE cycle, using $Cl_2$ or HBr as an etchant, is used to etch intrinsic polysilicon layer, 4a, creating the intrinsic polysilicon gate structure in MOS logic region, 40, and also used to etch exposed doped polysilicon layer, 4b, creating the doped polysilicon gate structure, capped with second silicon oxide layer, 6, in MOS memory region, 30. The result of the RIE procedures is schematically shown in FIG. 4. Photoresist shape, 8, is again removed via plasma oxygen ashing and careful wet cleans.

Figure 5:
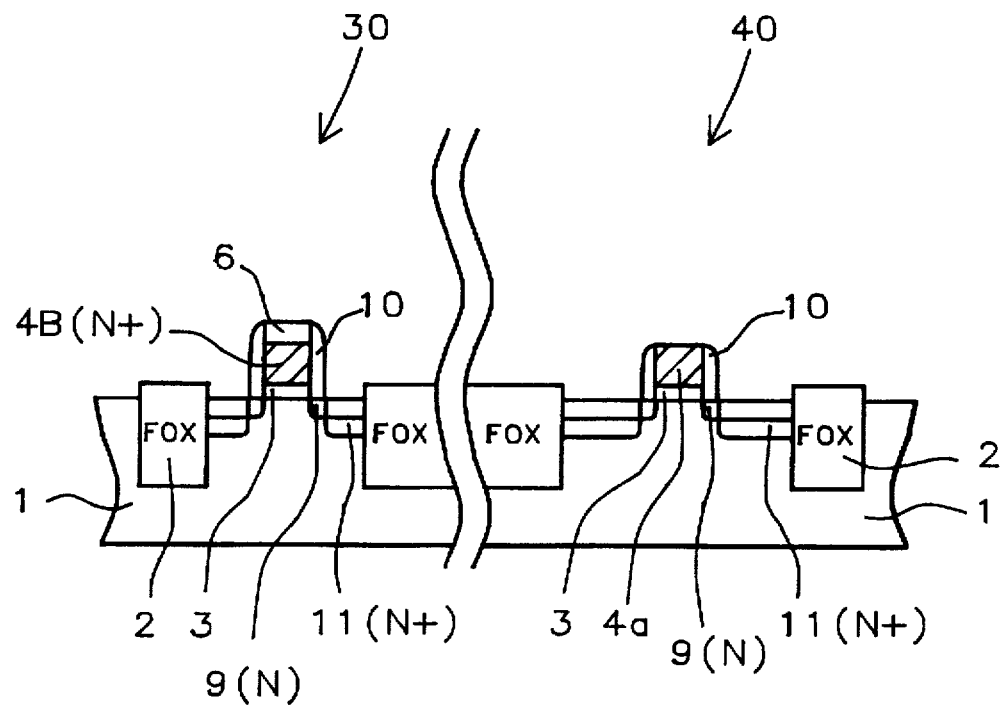

FIG. 5, shows the creation of source and drain regions for both MOS memory device region, 30 and for MOS logic device region, 40. First a phosphorous ion implantation procedure, at an energy between about 25 to 50 KeV, at a dose between about 5E12 to 5E13 atoms/$cm^2$, is used to produce a lightly doped source and drain regions, 9. Another layer of silicon oxide is next deposited, using LPCVD or plasma enhanced chemical vapor deposition, (PECVD), processing, at a temperature between about 400° to 800° C., to a thickness between about 1000 to 4500 Angstroms. Anisotropic, RIE processing, using $CHF_3$ as an etchant, is used to create insulator sidewall spacers, 10, shown in FIG. 5. Next another ion implantation procedure, using either phosphorous or arsenic, at an energy between about 50 to 75 KeV, at a dose between about 1E14 to 5E15 atoms/$cm^2$, to create N+, heavily doped N+ source and drain regions, 11, while also doping the polysilicon gate in the MOS logic region 40.

Figure 6:
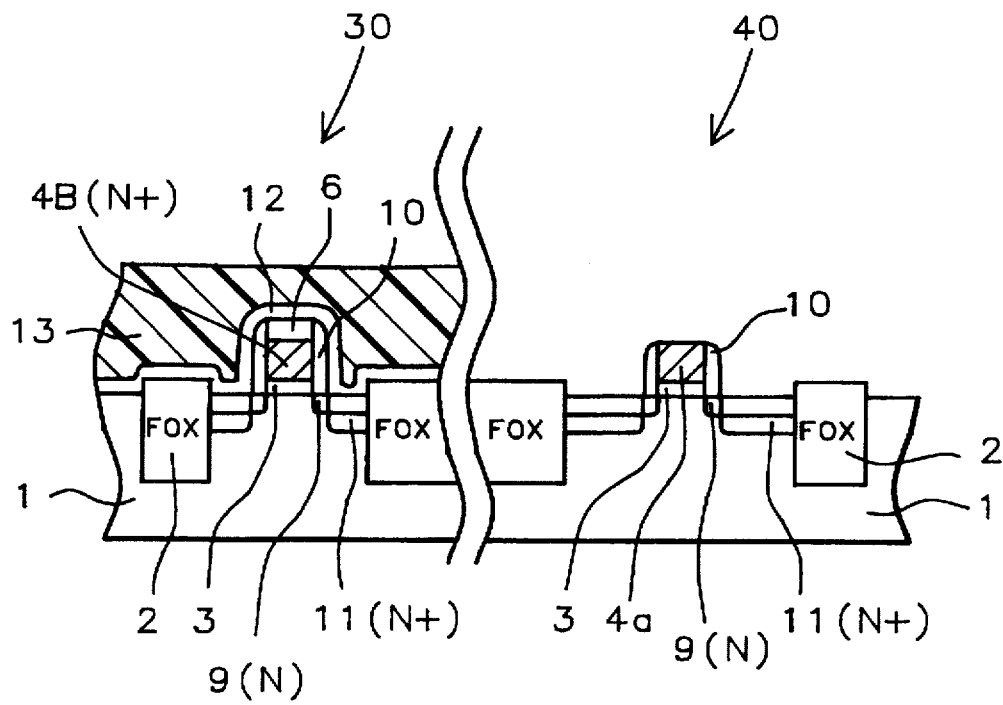

A layer of silicon nitride, 12, is next deposited, using either LPCVD or PECVD processing, at a temperature between about 300° to 800° C., to a thickness between about 150 to 600 Angstroms. Photoresist shape, 13, is used to block out MOS memory device region, 30, allowing silicon nitride layer, 12, to be removed from MOS logic device region, 40, via RIE procedures, using $CH_3F$ as an etchant. This is schematically shown in FIG. 6. Photoresist shape, 13, is once again removed via plasma oxygen ashing, and careful wet cleans. Silicon nitride layer, 12, will protect MOS memory device region, 30, from subsequent metal silicide processing.

Figure 7:
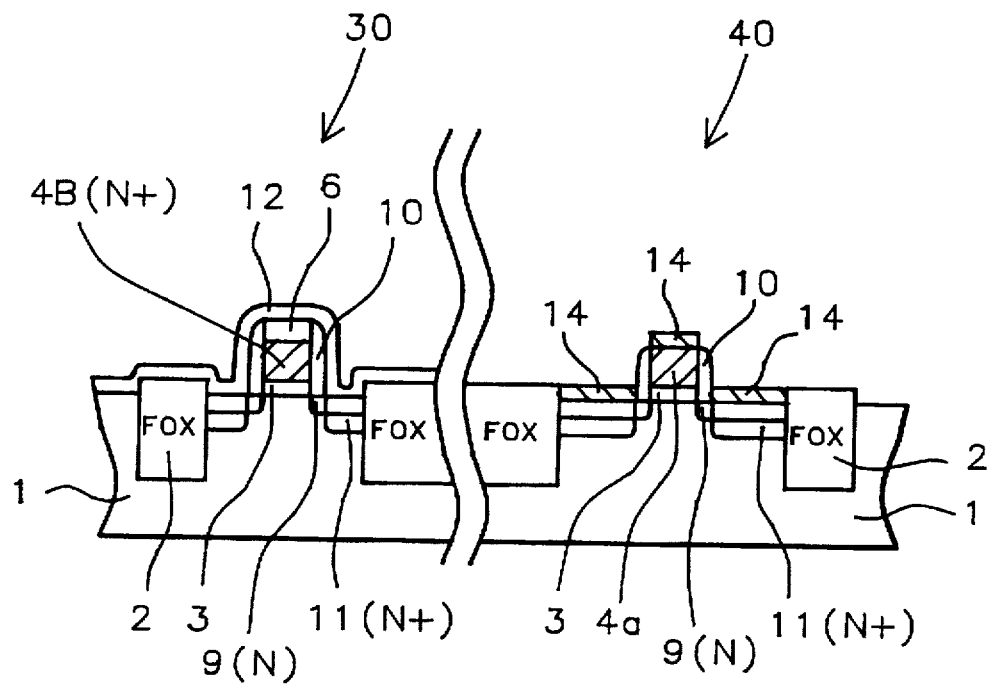

A layer of titanium is next deposited, to a thickness between about 200 to 600 Angstroms, using radio frequency (r.f.) sputtering procedures. The titanium layer deposits on silicon nitride layer, 12, of MOS memory device region, 30, while depositing on insulator spacer, 10, as well as on heavily doped source and drain regions, 11, and on the top surface of polysilicon gate structure, 4a, in MOS logic device region, 40. An anneal is next performed to convert the titanium layer, overlying heavily doped source and drain regions, 11, and the titanium layer, overlying the top surface of intrinsic polysilicon gate structure, 4a, both in the MOS logic device region, 40, to between about 200 to 600 Angstroms of titanium silicide layer, 14. The anneal is performed using conventional furnace procedures, at a temperature between about 550° to 550° C., for between about 1 to 10 min, in an $N_2$ ambient. The anneal can also be performed using the preferred method of rapid thermal annealing, (RTA), procedures, at a temperature between about 600° to 750° C., for a time between about 10 to 60 sec., in an RTA apparatus, using a $N^2$ ambient. Unreacted titanium, or titanium overlying silicon nitride layer, 12, in MOS memory device region, 30, as well as titanium overlying insulator spacers, 10, in the MOS logic device region, is removed using a solution of 1:1:5 of $NH_4OH$—$H_2O_2$—$H_2O$, at a temperature between about 30° to 70° C. This Self-ALIgned siliCIDE, (SALICIDE), procedure allows the silicide to be a permanent layer only in areas of the MOS logic device region, 40, an area in which the decreases in resistance of the intrinsic polysilicon gate structure, as well as the decrease in the source and drain resistance, is desired for performance enhancements. This is schematically shown in FIG. 7.

Figure 8:
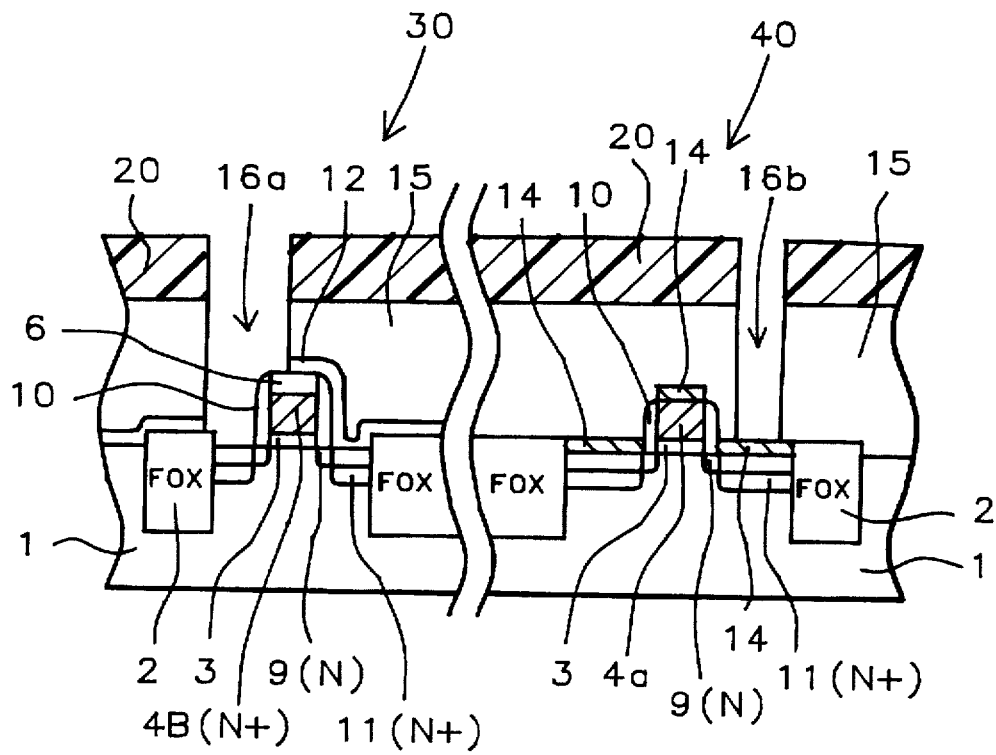

An interlevel oxide layer, 15, is next deposited, via PECVD procedures, at a temperature between about 300° to 600° C., to a thickness between about 10000 to 20000 Angstroms. A chemical mechanical polishing procedure is used to planarize interlevel oxide layer, 15. A photoresist shape, 20, is then used to allow the opening of contact holes to be made to heavily doped source and drain regions of the MOS memory device region, 30, as well as MOS logic device region, 40. Referring first to contact hole, 16a, used to expose the heavily doped source and drain region, 11, of MOS memory device region, 30. Density requirements for memory applications make the concept of opening a contact hole, and fully land the contact hole on a source and drain region, difficult to achieve. In order to conserve silicon real estate, a self-aligned contact, (SAC), structure has been employed. This procedure comprises a lithographic contact hole dimension, with a diameter greater than the diameter of the source and drain region, which resides between the FOX region, 2, and the insulator spacer-doped polysilicon gate structure. Since the SAC opening, 16a, in the MOS memory device region, will overlap the FOX region, 2, and the silicon oxide capped, doped polysilicon gate structure, the area allotted to the source and drain region can be minimized, thus reducing the area of the MOS memory device, and thus increasing density. Thus SAC opening, 16a, is made using anisotropic RIE of interlevel oxide layer, using $CHF_3$ as an etchant, stopping on silicon nitride layer 12. Silicon nitride layer 12, is then removed via another RIE procedure, using $CH_3F$ as an etchant. In MOS logic device region, 40, the same anisotropic RIE procedure is used to open a conventional contact hole, 16b, in interlevel oxide layer, 15. The ability of $CHF_3$ to selectively etch silicon oxide, while not attacking silicon nitride or titanium silicide, allows the overetching to occur in contact hole, 16b. The ability of $CH_3F$ to selectively etch silicon nitride, while not attacking silicide or oxide, allows the removal of silicon nitride to occur without damage to the capped oxide in the SAC opening, and in the source and drain region in the MOS logic device region, during the removal of the remaining silicon nitride layer, 12, in the SAC opening, 16a. This is schematically shown in FIG. 8. Contact holes are also formed to the polysilicon gate structures, for MOS memory and logic regions, using the identical photolithographic and RIE procedures just described, however not shown in FIG. 8. Photoresist shape, 20, is removed using plasma oxygen ashing and careful wet cleans.

Figure 9:
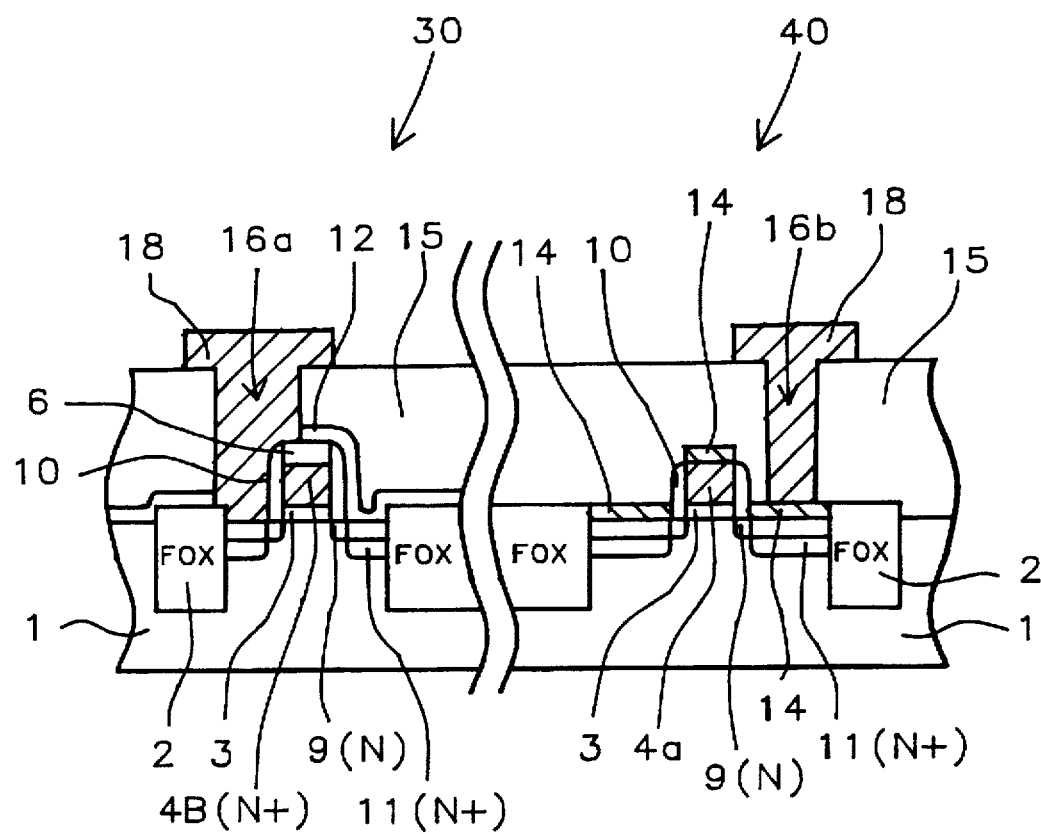

A metal layer of aluminum, containing between about 0.5 to 3.0% copper, and between about 0 to 2.0% silicon, is next deposited using r.f sputtering procedures, to a thickness between about 3000 to 6000 Angstroms. Conventional photolithographic and RIE procedures, using $Cl_2$ as an etchant, are used to create metal contact structures, 18, used as the metal contacts to the heavily doped source and drain regions of both MOS memory and MOS logic device regions. Photoresist removal is once again performed using plasma oxygen ashing, followed by careful wet cleans. The result of these process steps is schematically shown in FIG. 9.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating Metal Oxide Semiconductor (MOS) memory devices, and MOS logic devices on a single semiconductor substrate, comprising the steps of:

forming isolation regions in a first region of said semiconductor substrate, to be used for said MOS memory devices, and forming isolation regions in a second region of said semiconductor substrate, to be used for said MOS logic devices;

growing a gate insulator layer on said first region of said semiconductor substrate, and on said second region of said semiconductor substrate;

depositing a polysilicon layer on said gate insulator layer;

depositing a first dielectric layer on said polysilicon layer, in said first region of said semiconductor substrate, and on said polysilicon layer, in said second region of said semiconductor substrate;

removing said first dielectric layer from a top surface of said polysilicon layer, in said second region of said semiconductor substrate;

patterning of said first dielectric layer, and of said polysilicon layer, in said first region of said semiconductor substrate, to create an oxide capped, polysilicon gate structure, on said gate insulator layer, in said first region of said semiconductor substrate, to be used for said MOS memory devices, and patterning of said polysilicon layer, in said second region of said semiconductor substrate, to create a polysilicon gate structure, in said second region of said semiconductor substrate, to used for said MOS logic devices;

forming spacers on sides of said oxide capped, polysilicon gate structure, in said first region of said semiconductor substrate, and forming spacers on the sides of said polysilicon gate structure, in said second region of said semiconductor substrate;

ion implanting a first conductivity imparting dopant into said first region of said semiconductor substrate, not covered by said oxide capped, polysilicon gate structure, and not covered by said spacers, to form heavily doped source and drain regions for said MOS memory devices, and ion implanting said first conductivity imparting dopant into said second region of said semiconductor substrate, not covered by said polysilicon gate structure, and by said spacers, to form heavily doped source and drain regions for said MOS logic devices, and also ion implanting said first conductivity imparting dopant into said polysilicon gate structure, in said second region of said semiconductor substrate, to form a doped polysilicon gate structure for said MOS logic devices;

depositing a second dielectric layer;

removing said second dielectric layer from said second region of said semiconductor substrate, exposing top surface of said doped polysilicon gate structure, and said heavily doped source and drain regions, while leaving said second dielectric layer in said first region of said semiconductor substrate, overlying said oxide capped, polysilicon gate structure, and said heavily doped source and drain regions;

depositing a metal layer;

forming a metal silicide layer using the metal layer on top surface of said doped polysilicon gate structure, and said heavily doped source and drain regions, in said second region of said semiconductor substrate, while leaving unreacted metal in regions in area where said metal layer overlaid said spacers, in said second region of said semiconductor substrate, and leaving unreacted metal in regions where said metal layer overlaid said second dielectric layer, in said first region of said semiconductor substrate;

removing said unreacted metal;

depositing an interlevel insulator layer;

planarizing said interlevel insulator layer;

opening a self-aligned contact hole in said interlevel insulator layer and in said second dielectric layer, exposing said heavily doped source and drain region, in said first region of said semiconductor substrate, and with said self-aligned contact hole overlapping a portion of said isolation region, and overlapping a region of said oxide capped, polysilicon gate structure, exposing a region of a top surface of said isolation region, and a region of a top surface of said oxide capped, polysilicon gate structure;

opening a contact hole in said interlevel insulator layer, exposing said metal silicide layer, on said heavily doped source and drain region, in said second region of said semiconductor substrate;

depositing a contact metallization layer;

forming a self-aligned contact, metal structure, to said heavily doped source and drain region, in said first region of said semiconductor substrate, used for said MOS memory devices, with said self-aligned contact, metal structure overlapping a region of the top surface of said isolation region, and a region of the top surface of said oxide capped, polysilicon gate structure; and forming a metal contact structure to said metal silicide layer, on said heavily doped source and drain region, in said second region of said semiconductor substrate, used for said MOS logic devices.

2. The method of claim 1, wherein said isolation regions are field oxide regions, formed via thermal oxidation of regions of said semiconductor substrate, or said isolation regions are silicon oxide filled shallow trenches, formed via anisotropic RIE of said semiconductor substrate, to a depth between about 2000 to 7000 Angstroms, and filled with a silicon oxide layer, deposited using low pressure chemical vapor deposition (LPCVD) or plasma enhanced chemical vapor deposition (PECVD) procedures, at a temperature between about 400° to 800° C., to a thickness between about 5000 to 14000 Angstroms.

3. The method of claim 1, wherein said gate insulator layer is silicon dioxide, thermally grown in an oxygen-steam ambient, at a temperature between about 750° to 1000° C., to a thickness between about 40 to 150 Angstroms.

4. The method of claim 1, wherein said polysilicon layer is deposited intrinsically, using LPCVD procedures, at a temperature between about 400° to 700° C., to a thickness between about 1000 to 3000 Angstroms.

5. The method of claim 1, wherein said polysilicon layer, in said first region of said semiconductor is doped via ion implantation, using phosphorous, ion implanted at an energy between about 10 to 40 KeV, at a dose between about 1E15 to 1E16 atoms/cm$^2$.

6. The method of claim 1, wherein said oxide capped, polysilicon gate structure, in said first region of said semiconductor substrate, is formed using anisotropic reactive ion etch (RIE), using $CHF_3$ as an etchant for said first dielectric layer, and using $Cl_2$ as an etchant for said polysilicon layer.

7. The method of claim 1, wherein said polysilicon gate structure, in said second region of said semiconductor substrate, is formed using anisotropic RIE, using $Cl_2$ as an etchant for said polysilicon layer.

8. The method of claim 1, wherein said second dielectric layer is silicon nitride, deposited using LPCVD or PECVD procedures, at a temperature between about 300° to 800° C., to a thickness between about 150 to 600 Angstroms.

9. The method of claim 1, wherein said second dielectric layer is removed from said second region, of said semiconductor substrate, exposing top surface of said polysilicon gate structure, and exposing said heavily doped source and drain regions, using RIE procedures using $CH_3F$ as an etchant.

10. The method of claim 1, wherein said planarization, of said interlevel insulator layer, is performed using chemical mechanical polishing.

11. The method of claim 1, wherein the metal layer used to form said metal silicide is titanium, deposited using radio frequency (r.f.) sputtering, to a thickness between about 200 to 600 Angstroms.

12. The method of claim 1, wherein said metal silicide layer is titanium silicide, formed using rapid thermal annealing at a temperature between about 600° to 750° C., for a time between about 10 to 60 sec.

13. The method of claim 1, wherein said self-aligned contact hole is opened in said interlevel insulator layer, and in said second dielectric layer, using anisotropic RIE procedures using $CHF_3$ and $CH_3F$ as etchants, with said self-aligned contact hole exposing said heavily doped source and drain region, exposing said region of the top surface of said oxide capped, polysilicon gate structure, and exposing said region of the top surface of said isolation region.

14. A method of fabricating MOS memory devices, with a self-aligned contact structure for device density increases, and MOS logic devices, with titanium silicide-polysilicon gate structures for device performance enhancements, on a single semiconductor substrate, comprising the steps of:

creating shallow trenches in an MOS memory device region of said semiconductor substrate, and in an MOS logic device region of said semiconductor substrate;

filling said shallow trenches with a first silicon oxide layer;

growing a gate insulator layer on said semiconductor substrate exposed in said MOS memory device region, and exposed in said MOS logic device region;

depositing an intrinsic polysilicon layer;

ion implanting a first conductivity imparting dopant into an area of said intrinsic polysilicon layer, creating a doped polysilicon layer in said MOS memory device region, while leaving said intrinsic polysilicon layer in said MOS logic device region;

depositing a second silicon oxide layer;

removing said second silicon oxide layer from a top surface of said intrinsic polysilicon layer, in MOS logic device region;

patterning of said second silicon oxide layer, and of said doped polysilicon layer, to create an oxide capped, doped polysilicon gate structure, on said gate insulator layer, in said MOS memory device region, and patterning of said intrinsic polysilicon layer, to create an intrinsic polysilicon gate structure, on said gate insulator layer, in said MOS logic device region;

ion implanting a second conductivity imparting dopant into an area of said MOS memory device region, not covered by said oxide capped, doped polysilicon gate structure, to create a lightly doped source and drain regions, in said MOS memory device region, and ion implanting a second conductivity imparting dopant into an area of said MOS logic device region, not covered by said intrinsic polysilicon gate structure, to create lightly doped source and drain regions, in said MOS logic device region;

depositing a third silicon oxide layer;

anisotropic etching of said third silicon oxide layer to form silicon oxide sidewall spacers on sides of said oxide capped, doped polysilicon gate structure, in said MOS memory device region, and on sides of said intrinsic polysilicon gate structure, in said MOS logic device region;

ion implanting a third conductivity imparting dopant into an area of said MOS memory device region, not covered by said oxide capped, doped polysilicon gate structure, and not covered by said silicon oxide sidewall spacers, to create heavily doped source and drain regions, in said MOS memory device region, and ion implanting said third conductivity imparting dopant into an area of said MOS logic device region, not covered by said silicon oxide sidewall spacers, to create heavily doped source and drain regions, and also to dope said intrinsic polysilicon layer, in said MOS logic device region;

depositing a silicon nitride layer;

removing silicon nitride layer from said MOS logic device region, exposing top surface of said doped intrinsic polysilicon gate structure, and top surface of said heavily doped source and drain regions, while leaving said silicon nitride layer in said MOS memory device region, overlying said oxide capped, doped polysilicon gate structure, and said heavily doped source and drain regions;

depositing a titanium layer; annealing to form a titanium silicide layer on top surface of said doped intrinsic polysilicon gate structure, and on said heavily doped source and drain regions, in said MOS logic device region, while leaving said titanium layer, unreacted, in regions in which said titanium layer overlaid said silicon oxide sidewall spacers, in said MOS logic device region, and leaving unreacted titanium layer in said MOS memory device region, where said titanium layer overlaid said silicon nitride layer;

removal of said unreacted titanium layer;

depositing an interlevel insulator layer;

planarizing said interlevel insulator layer;

opening a self-aligned contact hole in said interlevel insulator layer, and in said silicon nitride layer, exposing said heavily doped source and drain region in said MOS memory device region, with said self-aligned contact hole opened to a diameter that includes overlapping a region of said oxide capped, doped polysilicon gate structure, and overlapping a region of said silicon oxide filled shallow trench;

opening a contact hole in said interlevel insulator layer, exposing said titanium silicide layer on said heavily doped source and drain region, in said MOS logic device region;

depositing a contact metallization layer;

forming a self-aligned contact structure to said heavily doped source and drain region, in said MOS memory device region, with said self-aligned contact structure overlapping a region of a top surface of said oxide capped, doped polysilicon gate structure, and said region of said silicon oxide filled shallow trench; and forming a metal contact structure to said titanium silicide layer, on said heavily doped source and drain region, in said MOS logic device region.

15. The method of claim 14, wherein said silicon oxide filled shallow trenches are formed via anisotropic RIE of said semiconductor substrate, to a depth between about 2000 to 7000 Angstroms, and filled with a first silicon oxide layer, deposited using LPCVD or PECVD procedures, at a temperature between about 400° to 800° C., to a thickness between about 5000 to 14000 Angstroms.

16. The method of claim 14, wherein said gate insulator layer is silicon dioxide, thermally grown in an oxygen-steam ambient at a temperature between about 750° to 1000° C., to a thickness between about 40 to 150 Angstroms.

17. The method of claim 14, wherein said intrinsic polysilicon layer is deposited using LPCVD procedures, at a temperature between about 400° to 700° C., to a thickness between about 1000 to 3000 Angstroms.

18. The method of claim 14, wherein said first conductivity imparting dopant, used to convert an area of said intrinsic polysilicon layer to said doped polysilicon layer, in said MOS memory device region, is phosphorous, ion implanted at an energy between about 10 to 40 KeV, at a dose between about 1E15 to 1E16 atoms/cm$^2$.

19. The method of claim 14, wherein said oxide capped, doped polysilicon gate structure is patterned using anisotropic RIE, using $CHF_3$ as an etchant for said second silicon oxide layer, and using $Cl_2$ as an etchant for said doped polysilicon layer.

20. The method of claim 14, wherein said intrinsic polysilicon gate structure is patterned using anisotropic RIE procedures, using $Cl_2$ as an etchant for said intrinsic polysilicon layer.

21. The method of claim 14, wherein said silicon nitride layer is deposited using LPCVD or PECVD procedures, at a temperature between about 300° to 800° C., to a thickness between about 150 to 600 Angstroms.

22. The method of claim 14, wherein said silicon nitride layer is removed from said MOS logic device regions, exposing said top surface of said doped intrinsic polysilicon gate structure, and exposing said heavily doped source and drain regions, via RIE procedures, using $CH_3F$ as an etchant.

23. The method of claim 14, wherein said titanium layer is deposited using r.f. sputtering, to a thickness between about 200 to 600 Angstroms.

24. The method of claim 14, wherein said titanium silicide is formed using rapid thermal annealing, at a temperature between about 600° to 750° C., for a time between about 10 to 60 sec, forming between about 200 to 600 Angstroms of said titanium silicide layer.

25. The method of claim 14, wherein said self-aligned contact hole is opened in said interlevel insulator layer, and in said silicon nitride layer, via anisotropic RIE procedures, using $CHF_3$ and $CH_3F$ as etchants, with said self-aligned contact hole exposing said heavily doped source and drain region, in said MOS memory device region, and exposing said region of the top surface of said oxide capped, doped polysilicon gate structure, and said region of said silicon oxide filled shallow trench.

* * * * *